United States Patent [19]

Lockard

[11] 4,089,041
[45] May 9, 1978

[54] CIRCUIT PROGRAMMING DEVICE

[75] Inventor: Joseph LaRue Lockard, Harrisburg, Pa.

[73] Assignee: AMP Incorporated, Harrisburg, Pa.

[21] Appl. No.: 602,952

[22] Filed: Aug. 7, 1975

[51] Int. Cl.² ............................................. H05K 1/04
[52] U.S. Cl. ................................. 361/403; 174/52 FP
[58] Field of Search .............. 317/101 CC, 101 CW, 317/101 CP; 29/626; 174/52 FP; 339/17 CF, 198 K, 17 C, 188, 156 F, 258 F, 252 F; 357/20; 338/319, 320; 361/421, 403, 418; 337/186

[56] References Cited

U.S. PATENT DOCUMENTS

| 2,613,252 | 10/1952 | Heibel | 361/421 |
|---|---|---|---|
| 3,327,174 | 6/1967 | Barre et al. | 317/101 CW |
| 3,846,740 | 11/1974 | Damon | 339/17 C |
| 3,877,771 | 4/1975 | Jensen | 339/99 R |
| 3,919,767 | 11/1975 | Maaz | 317/101 CE |
| 3,978,375 | 8/1976 | Fakui et al. | 361/421 |

FOREIGN PATENT DOCUMENTS 881,187  9/1971  Canada ........................... 317/101 CC

*Primary Examiner*—David Smith, Jr.
*Attorney, Agent, or Firm*—Gerald K. Kita

[57] ABSTRACT

The present invention relates to a circuit selection or programming device for a printed circuit board wherein a plurality of strap conductors are mounted on a dielectric substrate and provided with depending electrical leads for plugging into a printed circuit board. The strap conductors may be selectively punched out to provide an interrupted circuit condition. Alternatively the strap conductors may be selectively punched and formed to provide various types of electrical terminals to which may be connected electronic circuit components.

4 Claims, 7 Drawing Figures

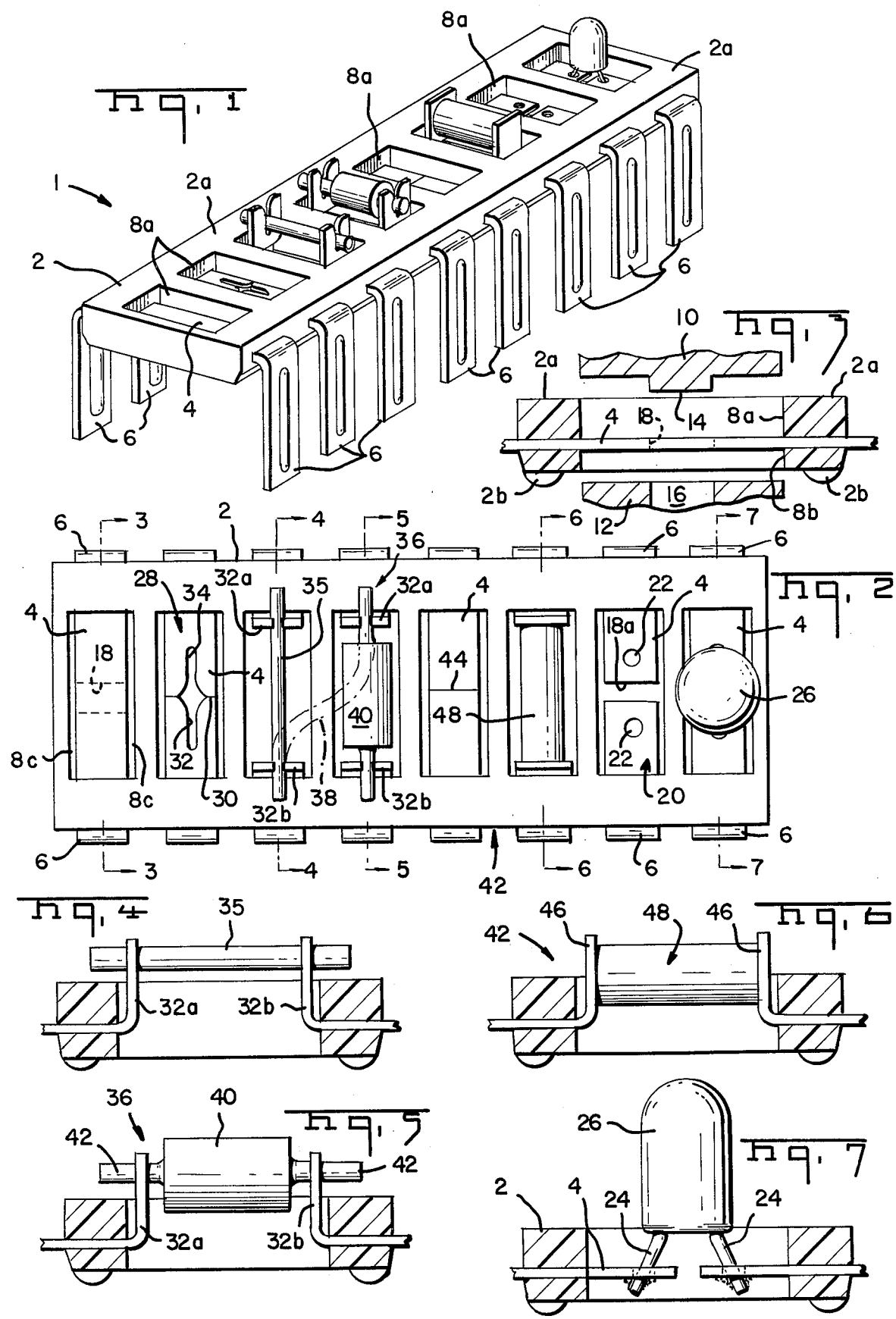

CIRCUIT PROGRAMMING DEVICE

FIELD OF THE INVENTION

The present invention relates to a method and apparatus for providing circuit selection among several printed paths of a printed circuit board. The invention further relates to a device and method for providing various types of electrical terminals for incorporating electrical circuit components on a printed circuit board.

BACKGROUND OF THE PRIOR ART

There has long existed a need for an economical means providing selective jumper connections across circuit paths of a printed circuit board. Board mounted switches have adequately provided this capability, particularly when the jumper connections are frequently switched on and off. Switches are inordinately expensive if used to provide jumper connections that are to be set only once and never changed. On the other hand to design printed circuit boards so as to eliminate subsequent jumper connections would require a large number of different circuit path configurations or programs, again an expensive as well as impractical undertaking. Accordingly there has been a need for a technique and apparatus by which jumper connections on a printed circuit board can be accomplished with relative ease, simplicity and low cost.

SUMMARY OF THE INVENTION

The present invention resides in a dielectric base or tray having a plurality of strap conductors mounted thereon. The strap conductors have depending electrical leads for pluggable connection to a printed circuit board. The removable portion of each strap conductor may be removed by a suitable tool thus providing an interruptable circuit. The dielectric base includes a tool receiving nest molded therein for suitable registration of a tool over a selected removable portion of a strap conductor. Other configurations may be punched into each strap conductor. Such configurations include slotted plate type electrical terminals, tab type electrical terminals, and apertures suitable for pluggable receipt of electrical leads. The dielectric base further includes electrical component receiving nests. The base thereby provides a mounting tray for electrical circuit components which are advantageously electrically connected to the strap conductors which incorporate them electrically in a circuit on a printed circuit board.

OBJECTS

An object of the present invention is to provide an interruptable circuit device comprising a spaced plurality of electrical strap conductors mounted on a dielectric base which has tool receiving nests adjacent the strap conductors exposing selectively removable portions thereof.

Another object of the present invention is to provide a circuit programming device comprising a dielectric base having a plurality of electrical strap conductors which can be selectively formed to provide electrical terminals to which electrical circuit components may be electrically connected whereby the base provides a tray for the electrical components.

Another object of the present invention is to provide a method for programming a printed circuit board with selectively completed or interrupted circuits utilizing strap conductors which are either continuous or interrupted by removing selected portions thereof as desired.

Another object of the present invention is to provide a method for programming a printed circuit board with strap conductors which are made selectively continuous or interrupted by removal of selected portions thereof and further wherein the strap conductors may be formed with electrical terminals to which electrical circuit components may be electrically connected.

Other objects and many attendant advantages of the present invention will become apparent upon perusal of the following description taken in conjunction with the accompanying drawings.

DESCRIPTION OF THE DRAWINGS

FIG. 1 is an enlarged perspective of a preferred embodiment according to the present invention illustrating various configurations and modes of operation selectively programmed into the embodiment.

FIG. 2 is a plan of the device shown in FIG. 1.

FIG. 3 is a section taken along the line 3—3 of FIG. 2.

FIG. 4 is a section taken along the lines 4—4 of FIG. 2.

FIG. 5 is a section taken along the line 5—5 of FIG. 2.

FIG. 6 is a section taken along the line of 6—6 of FIG. 2.

FIG. 7 is a section taken along the line 7—7 of FIG. 2.

DETAILED DESCRIPTION

With more particular reference to FIGS. 1, 2 and 3 of the drawings there is illustrated generally at 1 a circuit programming device according to the present invention comprising a dielectric base or tray 2 having a plurality of elongated strap conductors 4 molded and thereby embedded within the base 2. The strap conductors 4 are strips of conducting material for example brass. The strips are serially arranged parallel with one another. The strips further have end leg portions 6 which project outwardly of elongated sidewalls 2a of the base 2. The leg portions 6 are then bent in depending relationship to form opposed rows of electrical terminals or leads for pluggable connection into apertures of a printed circuit board. The opposed rows of depending terminals 6 therefore provide a dual-in-line package configuration for the programming device 1 which is consistent with the geometry of pluggable electronic devices having well known in the art dual-in-line package configurations. As shown in FIG. 3 the sidewalls 2a may be provided on the bottom surfaces thereof with projecting arcuate feet 2b which serve to register against a printed circuit board when the leads or terminals 6 thereof are pluggably connected in the printed circuit board. Also as shown in FIG. 3 taken in conjunction with FIGS. 1 and 2 the top surface of the base 2 is provided with a series of spaced rectangular recesses 8a over corresponding medial portions of the strap conductors 4 exposing the same. In similar fashion the bottom surface of the base 2 is provided with a series of recesses 8b directly under corresponding recesses 8a and exposing bottom surfaces of the strap conductors 4. In practice, the recesses 8b and 8a may communicate leaving elongated spaces 8c on opposite sides of each strap conductor 4. Also as an alternative the spaces 8c may be filled with dielectric material when fabricating by a molding process the base 2. Such a procedure prevents communication between the recesses 8a and 8b on opposite sides of a corresponding strap conductor 4. According to either alternative embodiment the strap conductors are utilized to provide jumper connections between normally spaced circuit paths of a printed circuit board.

In a printed circuit board there are often numerous electrical circuits which are selectively connected or remain disconnected according to the selected use of the printed circuit board. The present invention allows a designer of the printed circuit board to locate all the connectable circuit paths at one location. The electrical leads of the conductor straps 4 bridge across the normally interrupted or spaced paths of the printed circuit board and provide jumper connections thereacross. When it is desirable to leave a certain circuit path discontinuous or interrupted, a portion of a corresponding strap conductor 4 is removed in the following manner. With reference to FIG. 3 there is shown a pair of opposed jaws 10 and 12 of a suitable punching tool. The recess 8a provides a tool receiving nest which correctly registers the jaw 10 in position over a corresponding strap 4. In similar fashion the recess 8b provides a corresponding tool receiving nest which properly registers the jaw in position under the strap 4. For example, each of the jaws 10 and 12 have complimentary geometries fitting into the corresponding recesses 8a and 8b. The jaw 10 has a projecting male punching die 14 and the jaw 12 has a corresponding female die portion 16. The jaws 10 and 12 are received in registration within the corresponding recesses 8a and 8b and are then closed together, or toward each other, with the result that the male die 14 punches through and removes a selectively removable portion 18 of a corresponding strap 4. The female die portion 16 accordingly receives the male die portion 14 to facilitate removal of the removable portion 18 from the strap 4. As shown in FIG. 2 generally at 20 a corresponding strap portion 4 is bifurcated at 18a by the absence of the removable portion 18 thereof. Thus the circuit which would be jumpered across by the discontinuous strap at 20 in FIG. 2 will become discontinuous upon selective removal of the removable portion 18. If it is desired in the future to rejoin the bifurcated portions of the discontinuous strap solder may be placed in the recess 8a to adhere and jumper across the bifurcated portions and thereby reconnect the strap portions to provide a jumper connection.

As an alternative feature the punched jaws 10 and 12 may be further provided with additional configurations such as an aperture 22 formed in each bifurcated portion of the strap shown at 20. The apertures 22 are formed simultaneously upon punching out the removable portion 18, and thereby with one closure of the punching tool jaws 10 and 12. As shown in FIG. 7 the apertures may receive the leads 24 of a diode 26 which may be a light emitting type or the current directional type. Leads 24 may then be soldered within the apertures 22. Accordingly by modifying the tool jaws 10 and 12 to provide the apertures 22 as well as to bifurcate a corresponding strap 4 apertured tab type electrical terminals may be formed, and apertures punched out so as to accommodate an electrical circuit component such as the diode 26. It should be understood that any other type of electrical circuit component with leads may be utilized instead of the diode 26.

By modifying the tool jaws 10 and 12 with different configurations other types of electrical terminals may be punched out and formed on corresponding straps 4. For example as shown in FIGS. 2, 4 and 5, the tool jaws may be so configured by one having ordinary skill in the art so as to punch out and form in a strap 4, shown at 28 in FIG. 2, notched tab type electrical terminals. This is accomplished by bifurcating the strap 4 along a seam 30 and simultaneously forming notches 32 and 34 which communicate with each other and with the open seam 30. The strap is bifurcated into a pair of notched tab type terminals. The tab type terminals then are bent outwardly of the plane of the original strap 4 as shown in FIG. 4. What results is a pair of vertically projecting notched tabs 32a and 32b having their notches 32 and 34 respectively aligned. An electrical conductor such as a length of wire 35 may be forced into receipt within the notches 32 and 34 to electrically bridge the wire across the notched tabs 32a and 32b. The tabs thereby electrically and mechanically grip across the cross section of the wire. Additional tab portions 32a and 32b are illustrated generally at 36 in FIG. 2. For purposes of illustration an optional wire conductor shown in phantom outline at 38 may be utilized to bridge between spaced straps 4 which are provided with the notched tabs 32a and 32b. Thus the straps 4 may be stamped and formed with notched plate type terminals for lengths of wire to bridge across bifurcated portions of a strap 4 or to cross connect straps 4 to one another.

As shown in FIG. 5 the tab portions 32a and 32b at 36 may be bridged across by an electrical circuit component 40 in the form of a resistor or capacitor having its electrical leads 42 respectively electrically connected to the notched plate tabs 32a and 32b in the well known manner.

At 42 in FIGS. 2 and 6 a selected strap 4 may be bifurcated by an open seam 44 formed by the correctly configured tool jaws 10 and 12. What results is a pair of tab terminals 46 which are bent outwardly of the plane of the original strap 4 to provide parallel spaced tabs which grippingly engage opposite contact surfaces of a leadless type electrical circuit component illustrated at 48. The tabs 46 may be electrically secured to the contact surfaces of the component 48 by solder for example.

What has been illustrated and described are various techniques for programming an electrical printed circuit board with jumper connections or interruptable jumper connections or electrical components. The base 2 advantageously provides a tray for any electrical components connected to the formed terminals. Although specific embodiments and modifications thereof are described, other modifications and embodiments obvious to one having ordinary skill in the art are intended to be covered in the spirit and scope of the appended claims.

What is claimed is:

1. A method for providing a program of interruptable jumper connections across a plurality of spaced circuit paths on the flat surface of a circuit board, comprising the steps of:

embedding a plurality of normally electrically continuous conductors in a dielectric base, each of said conductors being provided with a pair of integral lead portions projecting from opposite sides of said base, bending said lead portion proximate said sides of said base to provide vertically depending electrical leads, exposing portions of said conductors in corresponding recesses provided in said base, dividing one or more selected exposed portions into respective spaced conductor portions subsequent to embedding said conductors in said base thereby electrically interrupting each said selected normally continuous conductor and thereby providing a selective program of conductors comprising only divided conductors on said base or a combination of divided and continuous conductors on said base, mounting said dielectric base onto said flat surface of said circuit board, electrically connecting corresponding electrical leads of said conductors to selected spaced circuit paths whereby each said continuous conductor of said selective program provides an electrically conductive jumper connection across corresponding selective spaced circuit paths and whereby each said divided conductor of said selective program is electrically interrupted to prevent a jumper connection across corresponding selected spaced circuit paths, bending free end portions of said spaced conductor portions of at least one said divided conductor to project vertically upward from said base to provide spaced tab type electrical terminals defining therebetween an electrical component receiving space in vertical alignment with a corresponding recess.

2. A method for providing a program of interruptable jumper connections across a plurality of spaced circuit paths on the flat surface of a circuit board, comprising the steps of:

embedding a plurality of normally electrically continuous conductors in a dielectric base, each of said conductors being provided with a pair of integral lead portions projecting from opposite sides of said base, bending said lead portions proximate said sides of said base to provide vertically depending electrical leads, exposing portions of said conductors in corresponding recesses provided in said base, dividing one or more selected exposed portions into respective spaced conductor portions subsequent to embedding said conductors in said base thereby electrically interrupting each said selected normally continuous conductor and thereby providing a selective program of conductors comprising only divided conductors on said base or a combination of divided and continuous conductors on said base, mounting said dielectric base onto said flat surface of said circuit board, electrically connecting corresponding electrical leads of said conductors to selected spaced circuit paths whereby each said continuous conductor of said selective program provides an electrically conductive jumper connection across corresponding selective spaced circuit paths and whereby each said divided conductor of said selective program is electrically interrupted to prevent a jumper connection across corresponding selected spaced circuit paths, forming a notch on each of said spaced conductor portions of at least one said divided conductor, and bending said spaced conductor portions to project vertically upward from said base to provide a vertically projecting pair of notched tab type electrical terminals with their notches aligned, said terminals being spaced apart and defining therebetween an electrical component receiving space in vertical alignment with a corresponding recess.

3. In a circuit programming device for mounting on a circuit board, having a plurality of flat conductors embedded in a molded dielectric base, at least some of which conductors have portions which project outwardly of opposite sides of said base and are bent vertically downward to provide electrical leads depending from said base, the improvement comprising:

said conductors being elongated and normally continuous to provide an electrical circuit therealong, said base having a plurality of elongated openings overlying corresponding normally continuous conductors and exposing portions of the same for individual selected division thereof whereby to interrupt a selected electrical circuit along a said individual conductor subsequent to embedding said conductors in said base, one or more of said normally continuous conductors being individually divided into a pair of opposed flat tabs embedded in said base at opposite sides of a corresponding individual recess, said opposed flat tabs being bent upwardly proximate said opposite sides of each said corresponding individual recess to provide vertically upward projecting pairs of flat contact surfaces at opposite ends of each said corresponding individual recess, each pair of said flat contact surfaces facing each other and defining therebetween an electrical component receiving space, each said corresponding individual recess defining a component receiving nest, whereby an electrical component electrically engaging a corresponding pair of said flat contact surfaces is received in a corresponding component receiving space and is at least partially received in a corresponding component receiving nest.

4. The structure as recited in claim 3, wherein, one or more selected pairs of said tabs are provided with aligned notches in said contact surfaces thereof, said notches communicating with free ends of said tabs to provide notched tab type terminals.

* * * * *